United States Patent
Tsai et al.

(10) Patent No.: US 10,256,266 B2
(45) Date of Patent: Apr. 9, 2019

(54) CHIP-SCALE IMAGE SENSOR PACKAGE AND ASSOCIATED METHOD OF MAKING

(71) Applicant: OmniVision Technologies, Inc., Santa Clara, CA (US)

(72) Inventors: Chen-Wei Tsai, Hsinchu County (TW); Chun-Sheng Fan, Hsinchu County (TW); Wei-Feng Lin, Hsinchu (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/480,131

(22) Filed: Apr. 5, 2017

(65) Prior Publication Data
US 2018/0294298 A1 Oct. 11, 2018

(51) Int. Cl.
*H01L 27/146* (2006.01)
*H04N 5/369* (2011.01)

(52) U.S. Cl.
CPC .... *H01L 27/14618* (2013.01); *H01L 27/1465* (2013.01); *H01L 27/14603* (2013.01); *H01L 27/14605* (2013.01); *H01L 27/14632* (2013.01); *H01L 27/14636* (2013.01); *H01L 27/14683* (2013.01); *H01L 27/14687* (2013.01); *H04N 5/369* (2013.01)

(58) Field of Classification Search
CPC ............... H01L 27/14603; H01L 27/14605
USPC ................................................. 257/432, 433
See application file for complete search history.

(56) References Cited

U.S. PATENT DOCUMENTS

| | | | | |
|---|---|---|---|---|
| 9,735,135 B2* | 8/2017 | Lee | | H01L 25/167 |
| 2009/0273047 A1* | 11/2009 | Yamamoto | | H01L 27/14618 |
| | | | | 257/432 |
| 2012/0008025 A1* | 1/2012 | Sasano | | H01L 27/14618 |
| | | | | 348/294 |
| 2012/0187512 A1 | 7/2012 | Zhihai et al. | | |
| 2012/0205766 A1* | 8/2012 | Takachi | | G02B 5/282 |
| | | | | 257/432 |
| 2012/0230669 A1* | 9/2012 | Abe | | H01L 27/14618 |
| | | | | 396/439 |
| 2013/0302912 A1 | 11/2013 | Zhong et al. | | |

(Continued)

OTHER PUBLICATIONS

Materion Corporation, https://materion.com/products/precision-optics/low-defect-wafer-level-coating; accessed on the Internet Jan. 6, 2017.

(Continued)

*Primary Examiner* — David Vu
*Assistant Examiner* — Brandon C Fox
(74) *Attorney, Agent, or Firm* — Lathrop Gage LLP (57) ABSTRACT

A chip-scale image sensor package includes a semiconductor substrate, a transparent substrate, a thin film, and a plurality of conductive pads. The semiconductor substrate has (i) a pixel array, and (ii) a peripheral region surrounding the pixel array. The transparent substrate covers the pixel array, has a bottom substrate surface proximate the pixel array, and a top substrate surface opposite the bottom substrate surface. The thin film is on a region of the top substrate surface directly above both (i) the entire pixel array and (ii) a portion of the peripheral region adjacent to the pixel array. Each of the plurality of conductive pads is located within the peripheral region, and is electrically connected to the pixel array. A portion of each of the plurality of conductive pads is not directly beneath the thin film.

10 Claims, 6 Drawing Sheets

(56) References Cited

U.S. PATENT DOCUMENTS

2014/0111876 A1* 4/2014 Tang .................. G02B 13/0045
  359/757
2015/0340397 A1 11/2015 Seo et al.
2016/0307750 A1 10/2016 Pool

OTHER PUBLICATIONS

Materion Corporation, https://materion.com/resource-center/product-data-and-related-literature/precision-optics/filters-and-filter-arrays/filter-arrays-features-and-characteristics; accessed on the Internet Jan. 7, 2017.
Salleo, A. et al, Polymer Thin-Film Transistor Arrays Patterned by Stamping, Adv. Funct. Mater. 2005, 15, 1105-1110.
Taiwan Patent Application No. 107109297, English translation of Office Action dated Nov. 12, 2018, 3 pages.

* cited by examiner

CHIP-SCALE IMAGE SENSOR PACKAGE AND ASSOCIATED METHOD OF MAKING

BACKGROUND

High-volume products such as tablet computers, mobile devices, and motor vehicles typically include at least one camera. The camera includes an image sensor that is manufactured, with hundreds of additional identical image sensors, on a single image-sensor wafer via a wafer-level manufacturing process. Some image-sensor wafers include a transparent layer, such as a cover glass, for protecting each image sensor. The transparent layer has a thin-film optical filter thereon that allows a predetermined wavelength range to be transmitted through the transparent layer to one of the image sensors. The thin-film optical filter tends to warp the transparent layer and, upon singulating the image-sensor wafer to yield image sensor dies, also delaminate from the transparent layer.

DETAILED DESCRIPTION OF THE EMBODIMENTS

Figure 1:
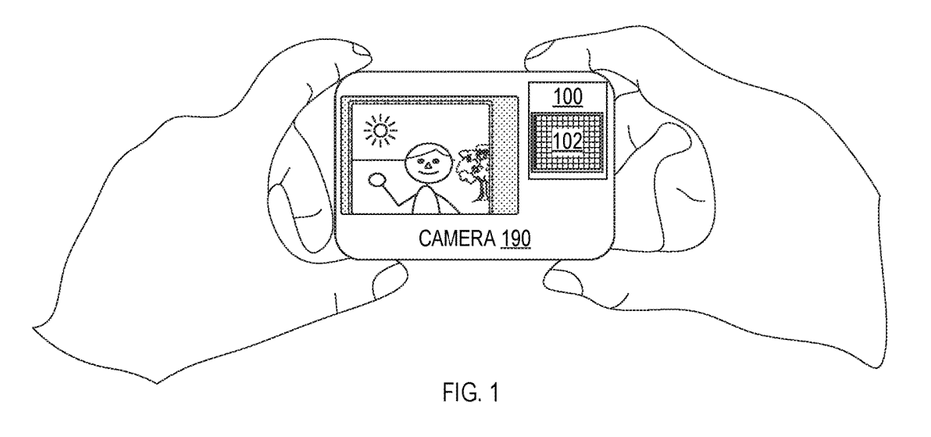
FIG. 1 depicts a camera that includes an image sensor die, which is an embodiment of a chip-scale image sensor package.
Figure 2:
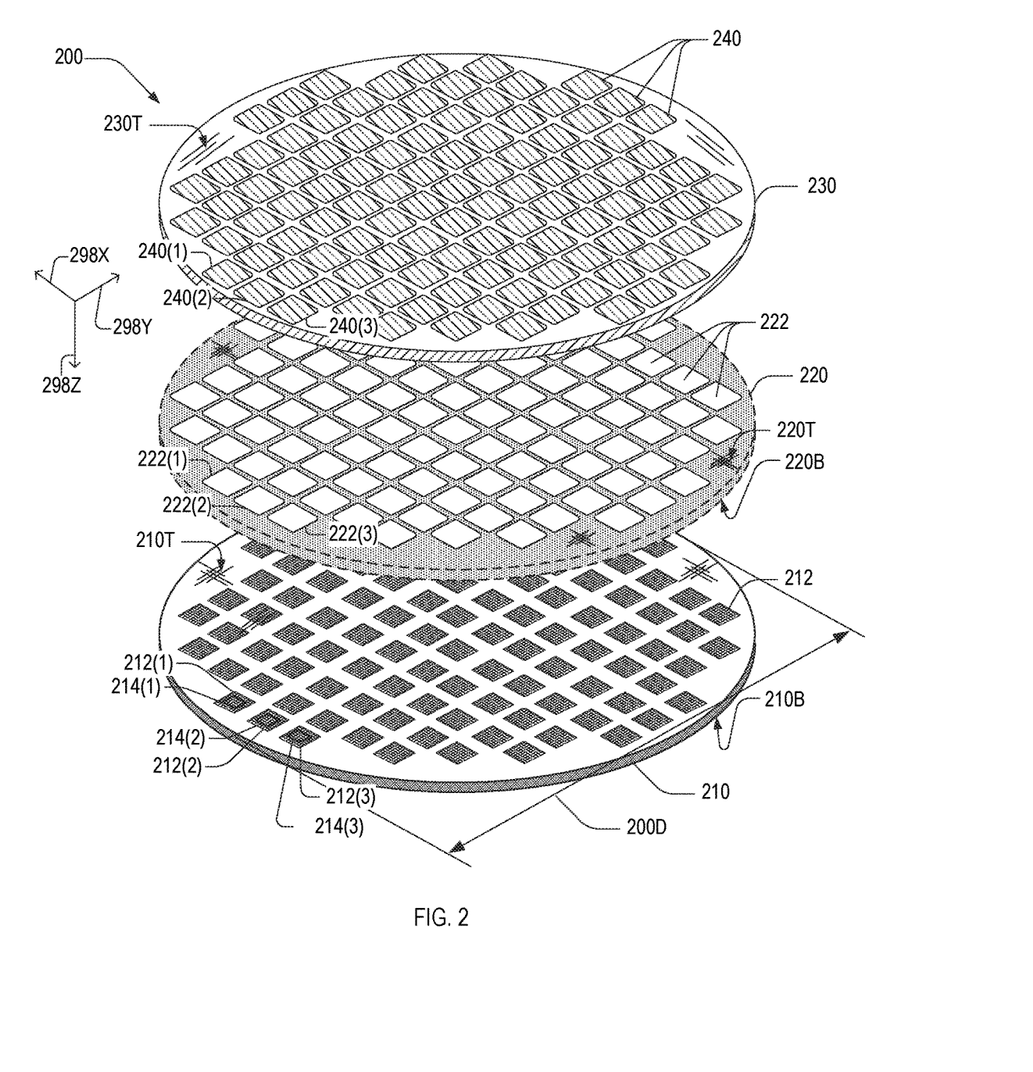
FIG. 2 is an exploded view of an encapsulated image-sensor wafer, in an embodiment, which includes a plurality of the image sensor dies of FIG. 1.
Figure 3:
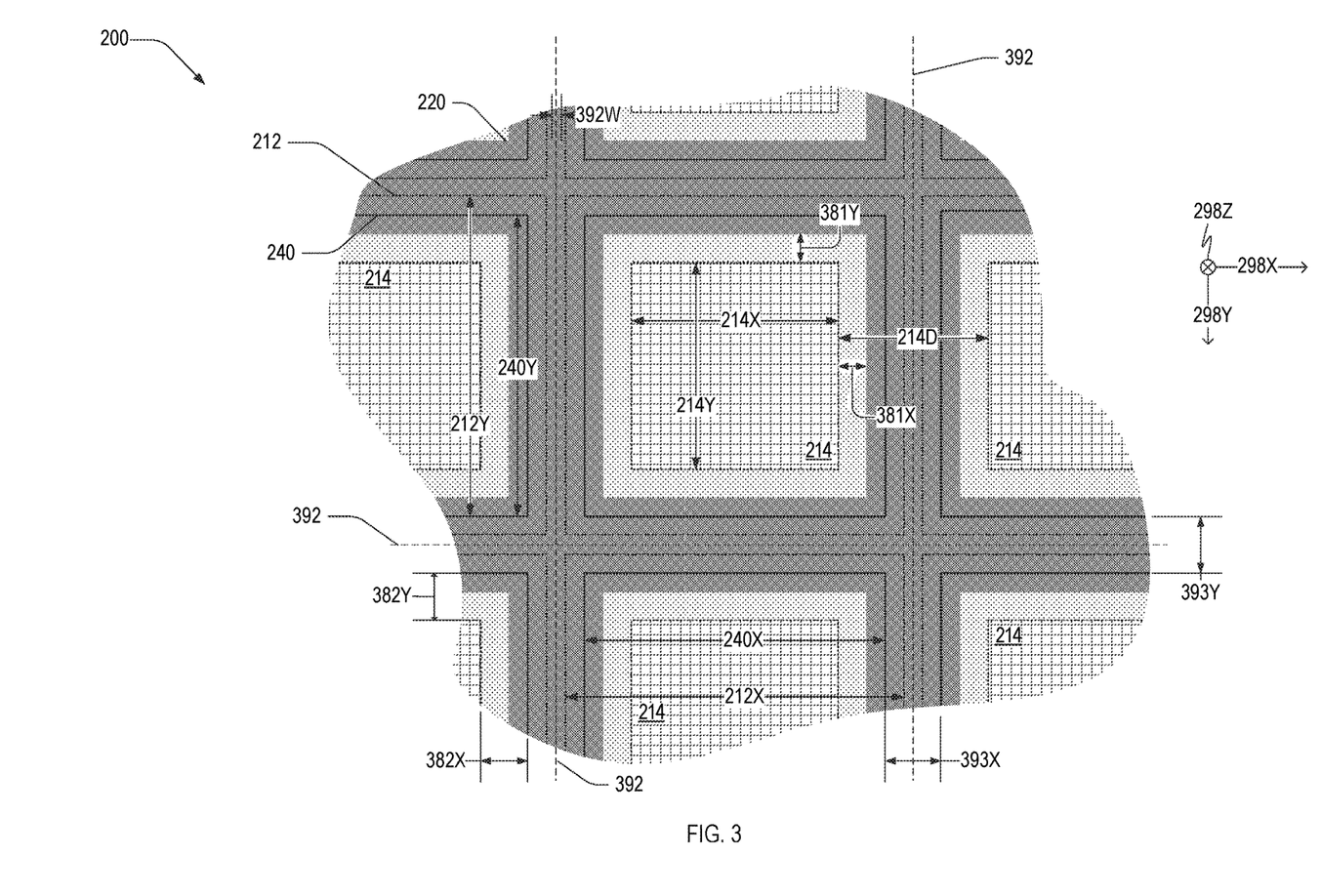
FIG. 3 is a plan view of the encapsulated image-sensor wafer of FIG. 2.

FIG. 1 depicts a camera 190 imaging a scene. Camera 190 includes an image sensor 100 having a pixel array 102. A plurality of individual image sensors 100 may be obtained by dicing an encapsulated image-sensor wafer, such as encapsulated image-sensor wafer 200 shown in FIGS. 2 and 3. FIGS. 2 and 3 are, respectively, an exploded view and a plan view of an encapsulated image-sensor wafer 200. A plurality of individual image sensors 100 may be obtained by dicing encapsulated image-sensor wafer 200 along dicing planes 392, shown in FIG. 3. FIGS. 2 and 3 are best viewed together in the following description.

Encapsulated image-sensor wafer 200 includes a device wafer 210 and transparent wafer 230, which are illustrated in FIG. 2 as separated in direction 298Z and in planes parallel to both directions 298X and 298Y. Directions 298X, 298Y, and 298Z are mutually orthogonal. Herein, spatial dimensions and distances denoted by reference numerals ending with X, Y, and Z correspond to dimensions and distances in directions 298X, 298Y, and 298Z respectively.

Encapsulated image-sensor wafer 200 may also include a spacer 220 between device wafer 210 and transparent wafer 230. Device wafer 210 may be formed of a semiconductor, such as silicon, germanium, silicon carbide, or a combination thereof. Device wafer 210 includes a plurality of image sensor dies 212, each of which includes a respective pixel array 214. Each pixel array 214 is in a plane perpendicular to direction 298Z. Device wafer 210 has a top surface 210T, which includes regions thereof between and adjacent to image sensor dies 212. Adjacent pixel arrays 214 are separated by a distance 214D, which depends on image sensor type. Distance 214D is, for example, between 800 µm and 1800 µm.

Transparent wafer 230 may be formed of a material that is transparent to at least one of visible light and IR light, such as a glass or a polymer. Herein, visible light refers to electromagnetic radiation with a free-space wavelength between 0.4 µm and 0.7 µm. IR light refers to electromagnetic radiation a free-space wavelength between 0.7 µm and 1.0 µm. Herein, and unless otherwise specified, a material with an extinction coefficient $\kappa < 10^{-4}$ at a free-space wavelength $\lambda_0$ is considered transparent at wavelength $\lambda_0$.

Transparent wafer 230 has a top surface 230T with a plurality of thin films 240 thereon. Each of the plurality of thin films 240 is aligned with a respective one of the plurality of pixel arrays 214. For example, thin films 240(1-3) are aligned with respective pixel arrays 214(1-3) of respective image sensor dies 212(1-3). For one or more image sensor dies 212, the entirety of pixel array 214 may be directly beneath the thin film 240 aligned therewith. Adjacent thin films 240 are separated by respective inter-film distances 393X and 393Y. Inter-film distances 393X and 393Y are each 300±100 µm, for example. Inter-film distances 393X and 393Y also denote widths of respective inter-film regions between adjacent thin films 240.

Thin film 240 may be a bandpass filter or a cut-off filter, such as an IR bandpass filter, a visible bandpass filter, or an IR cut filter. An exemplary thin film 240 is an IR cut filter that transmits less than ten percent of incident IR light while transmitting more than ninety percent of incident visible light. Without departing from the scope hereof, thin film 240 may be configured to have other spectral transmission functions.

Each thin film 240 may be a single-layer thin film or a multi-layer thin film. For example, thin film 240 may be an absorptive filter that absorbs infrared light and transmits visible light. For example, thin-film coating 240 may be formed of an aluminophosphate glass that includes cupric oxide, as described in U.S. Pat. No. 5,173,212A.

Alternatively, thin film 240 may be a multi-layer interference filter. Such a multi-layer interference filter has, for example, between forty and eighty layers and may have a total thickness between three micrometers and eight micrometers.

Spacer 220 may be a monolithic spacer wafer having a plurality of apertures 222 therethrough. Each aperture 222 is aligned with both an image sensor die 212 and thin film 240. For example, apertures 222(1-3) are respectively aligned with thin films 240(1-3) and pixel arrays 214(1-3). Spacer 220 may be part of transparent wafer 230, such that bottom surface 230B has a plurality of recesses therein each aligned to a respective thin film coating of plurality of thin films 240.

Encapsulated image-sensor wafer 200 may include additional layers without departing from the scope hereof. For example, encapsulated image-sensor wafer 200 may include, on a bottom surface 210B of device wafer 210, one or more insulating layers and a conductive redistribution layer.

Encapsulated image-sensor wafer 200 has a diameter 200D, which ranges from two hundred and three hundred millimeters, for example. Each image sensor die 212 has dimensions 212X and 212Y. Dimensions 212X and 212Y are, for example, between 0.9 millimeters and twelve millimeters. Each pixel array 214 has dimensions 214X and 214Y in a plane parallel to surface 230T. Dimensions 214X and 214Y are, for example, between 0.7 millimeters and seven millimeters. For clarity of illustration, not all image sensor dies 212 and thin films 240 are shown in FIG. 2, and image sensor dies 212 and thin films 240 are enlarged compared to the size of wafers 210 and 230.

Each thin film 240 has dimensions 240X and 240Y. A thin film 240 may be sized such that at least one of (a) dimension 240X is less than dimension 212X and (b) dimension 240Y is less than dimension 212Y. Thin-film dimension 240X exceeds pixel-array dimension 214X by twice a distance 382X. Thin-film dimension 240Y exceeds pixel-array dimensions 214Y by twice a distance 382Y. Each distance 382X and 382Y may be between 300 µm and 700 µm.

In the embodiment illustrated in FIGS. 2 and 3, dimension 240X is less than dimension 212X and dimension 240Y is less than dimension 212Y. In an alternative embodiment, when dimension 240X is less than dimension 212X and dimension 240Y exceeds than dimension 212Y, each thin film 240 may extend across transparent wafer 230 such that inter-film distance 393Y equals zero and thin films 240 form a one-dimensional array of thin-film coatings with each row being parallel to direction 298Y.

Pixel arrays 214 are each located at respective distances 381X and 381Y from spacer 220, which, for example, are at least one hundred micrometers per a fabrication design rule. For example, one or both of distances 381X,Y equals 366±20 µm.

Inter-film distances 393X,Y may be sized to both (i) accommodate a dicing instrument (e.g., a blade) along dicing plane 392 that has a kerf 392W and, after dicing, (ii) leave a portion of surface 230T uncovered by thin film 240. Leaving a portion of surface 230T uncovered facilitates inspection of a conductive pad on top surface 210T of wafer 210 with light having a wavelength blocked by thin film 240, e.g., visible or infrared light. The conductive pad may be part of a redistribution layer. Kerf 392W is 70 µm, for example.

Inter-film distances 393X,Y being non-zero provides technical benefits to encapsulated image-sensor wafer 200. First, a single optical filter on surface 230T, covering each image sensor die 212, may warp transparent wafer 230. Second, absent inter-film distances 393X,Y between adjacent thin films 240(1,2), thin film 240 is prone to cracking and delamination when encapsulated image-sensor wafer 200 is singulated along dicing plane 392.

Figure 4:
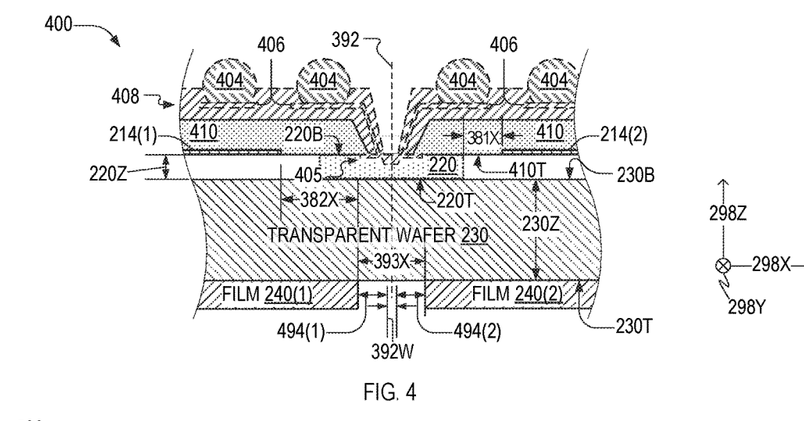
FIG. 4 is a cross-sectional view of the encapsulated image-sensor wafer of FIG. 2.

FIG. 4 is a cross-sectional view of an encapsulated image-sensor wafer 400. Encapsulated image-sensor wafer 400 is an example of encapsulated image-sensor wafer 200, and includes a device wafer 410, transparent wafer 230, and thin films 240. Transparent wafer 230 has a bottom surface 230B opposite its top surface 230T. Spacer 220 is between device wafer 210 and transparent wafer 230 and has a top surface 220T opposite a bottom surface 220B. Device wafer 410 has a top surface 410T. In an alternative embodiment, encapsulated image-sensor wafer 400 lacks spacer 220 such that surfaces 410T and 230B are touching.

Device wafer 410 is an example of device wafer 210 and includes pixel arrays 214(1) and 214(2). Top surface 230T of transparent wafer 230 has thin films 240(1) and 240(2) thereon. Pixel arrays 214(1,2) are on opposite sides of dicing plane 392. Similarly, thin films 240(1,2) are on opposite sides of dicing plane 392. Spacer 220 is on top surface 410T between pixel arrays 214(1) and 214(2), and at least partially surrounds pixel array 214. Herein, a figure element denoted by a reference numeral suffixed by a parenthetical numeral indicates an example of the element indicated by the reference numeral. For example, thin film 240(1) is an example (1) of thin film 240.

Encapsulated image-sensor wafer 400 may also include conductors 404, a redistribution layer (RDL) 406, and a dielectric layer 408, in which case, redistribution layer 406 electrically connects pixel arrays 214 to conductors 404. RDL 406 includes a conductive pad 405 located at least partially between top surface 410T and top surface 220T. Conductive pad 405 is electrically connected to RDL 406, and may be a contiguous part of RDL 406. Conductive pad 405 is electrically connected to one or more pixels of pixel array 214. Conductors 404 are solder balls of a ball-grid array, for example. Encapsulated image-sensor wafer 400 may include one or more layers between dielectric layer 408 and device wafer 210, such as an inter-metal dielectric layer, a low-K dielectric layer, and an inter-layer dielectric layer. Dielectric layer 408 is a polymer photoresist, for example.

FIG. 4 includes callouts for spatial dimensions of encapsulated image-sensor wafer 400 in orthogonal directions 298X and 298Z. In direction 298Z, device wafer 210 and transparent wafer 230 are separated by a distance 220Z, which is spanned by spacer 220 and any adhesive between spacer 220 and wafers 210, 230. Distance 220Z is 45±5 µm, for example. Transparent wafer 230 has a thickness 230Z, which is 400±10 µm, for example.

FIG. 4 illustrates inter-film distance 393X between adjacent thin films 240(1) and 240(2) and kerf 392W. FIG. 4 also illustrates distance 494(1), distance 494(2), and kerf 392W, the sum of which equal inter-film distance 393X.

Figure 5:
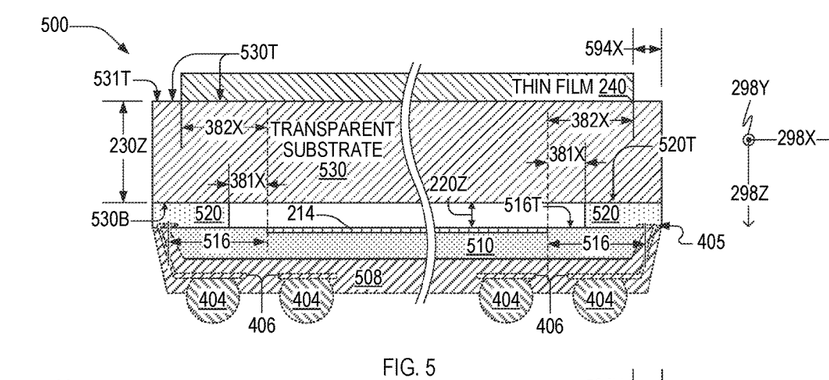
FIG. 5 is a cross-sectional view of a chip-scale image sensor package resulting from singulation of the encapsulated image-sensor wafer of FIGS. 2-4, in an embodiment.
Figure 6:
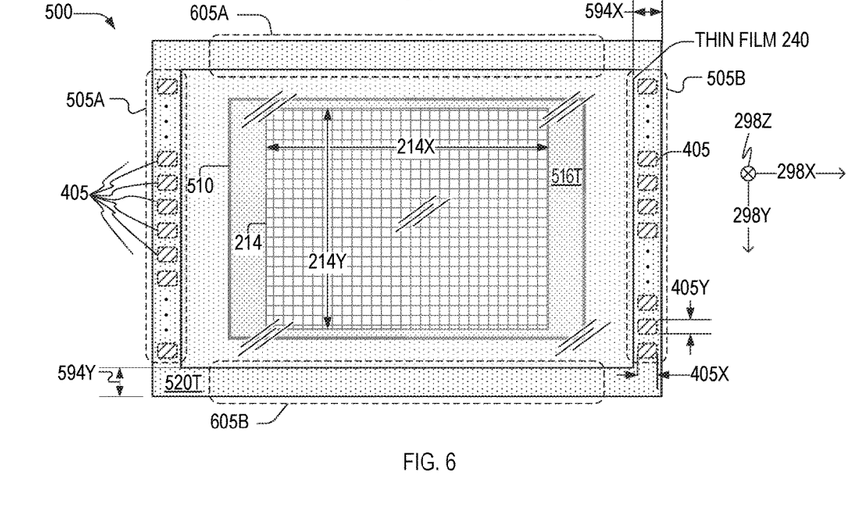
FIG. 6 is a plan view of chip-scale image sensor package of FIG. 5.

FIG. 5 is a cross-sectional view of a chip-scale image sensor package 500 resulting from singulation of encapsulated image-sensor wafer 400. FIG. 6 is a plan view of chip-scale image sensor package 500. FIGS. 5 and 6 are best viewed together in the following description, and include callouts for spatial dimensions of chip-scale image sensor package 500 in orthogonal directions 298X, 298Y, and 298Z. While FIG. 6 illustrates dimension 214X exceeding dimension 214Y, dimension 214Y may equal or exceed 214X without departing from the scope hereof.

Chip-scale image sensor package 500 includes a device substrate 510, a spacer 520, a transparent substrate 530, which are formed from device wafer 410, spacer wafer 220, transparent wafer 230, respectively upon singulation of encapsulated image-sensor wafer 400. Thin film 240 is on a top surface 530T of transparent substrate 530, which includes a bottom surface 530B proximate pixel array 214 and opposite top surface 530T. Chip-scale image sensor package 500 may also include conductors 404, redistribution layer 406, and a dielectric layer 508, in which case, redistribution layer 406 electrically connects pixel array 214 to conductors 404. Dielectric layer 508 is formed from dielectric layer 408 upon singulation of encapsulated image-sensor wafer 400.

Chip-scale image sensor package 500 includes a plurality of conductive pads 405 arranged in two arrays 505A and 505B oriented parallel to direction 298Y. Chip-scale image sensor package 500 may include additional conductive pads 405, e.g., in rows oriented parallel to direction 298X, in one or both of regions 605A and 605B of surface 520T.

Device substrate 510 includes pixel array 214, which is configured to detect light transmitted by thin film 240 and transparent substrate 530. Device substrate 510 includes a peripheral region 516 that surrounds pixel array 214. Spacer 520 is on a top surface 516T of region 516 and at least partially surrounds pixel array 214, as shown in FIG. 6. Top surface 516T corresponds to a portion of top surface 410T of device wafer 410. Transparent substrate 530 is attached to a top surface 520T of spacer 520 and covers pixel array 214. Chip-scale image sensor package 500 may include an adhesive between at least one of (a) surface 520T and bottom surface 530B and (b) top surface 520T and top surface 516T.

Thin film 240 is on at most a portion of top surface 530T such that (i) the entirety of pixel array 214 is directly beneath thin film 240, and (ii) at least a portion one conductive pad 405 is not directly beneath thin film 240. Thin film 240 partially covers surface top surface 530T of transparent substrate 530. For example, top surface 530T has a surface region 531T that is not covered by thin film 240. As illustrated in FIGS. 5 and 6, surface region 531T has dimensions 594X and 594Y. Conductive pad 405 has a dimensions 405X and 405Y, which are each, for example, 100±20 μm. Inter-film distance 393X may be the sum of kerf 392W and two times dimension 594X. Dimensions 594X and 594Y are each examples of distance 494.

To facilitate inspection of conductive pad 405, dimension 594X may exceed dimension 405X and dimension 594Y may exceed dimension 405Y. Given non-zero process-window tolerances, dimensions 594X,Y may exceed respective dimensions 405X,Y by at least the value of the process window tolerance related to bonding either wafer 220 or wafer 230 to device wafer 210. Such a process window tolerance is forty-five micrometers, for example.

Figure 7:
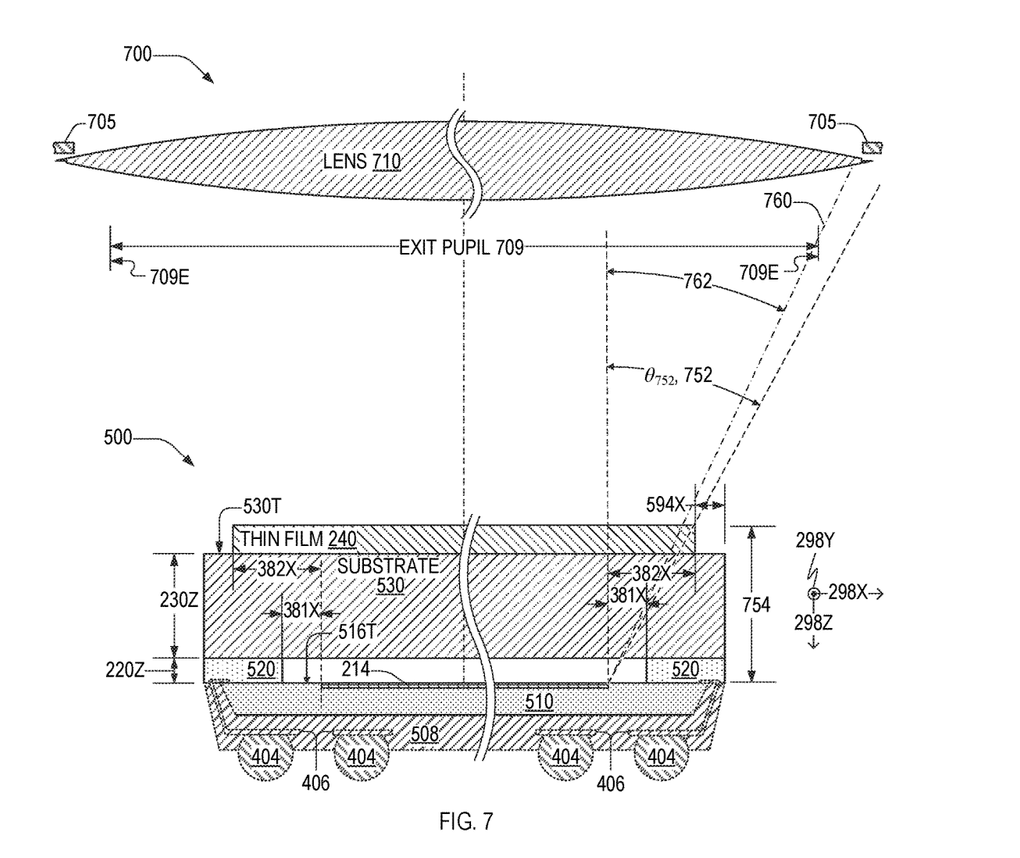
FIG. 7 is a cross-sectional view of an imaging system that includes the chip-scale image sensor package of FIGS. 5 and 6, in an embodiment.

FIG. 7 is a cross-sectional view of an imaging system 700 that includes chip-scale image sensor package 500 and an imaging lens 710. Imaging system 700 has an aperture stop 705 and may be part of camera 190 of FIG. 1. Imaging system 700 also has an exit pupil 709 corresponding to aperture stop 705. While imaging lens 710 is illustrated between aperture stop 705 and exit pupil 709, aperture stop 705 may located elsewhere without departing from the scope hereof. For example, when imaging lens 710 is a compound lens, aperture top 705 may be between optical elements of imaging lens 710.

FIG. 7 illustrates an angle 752, herein also referred to as $\theta_{752}$. Angle 752 is determined by distance 382X and a distance 754: $\tan \theta_{752} = x_{382}/z_{754}$, where $x_{382}$ and $z_{754}$ denote distance 382X and distance 754, respectively. Distance 754 is the distance between top surface 530T of transparent substrate 530 and top surface 516T device substrate 510. Distance 754 is, for example, the sum of distance 220Z and thickness 230Z. Angle 752 is 35°±5°, for example.

At least one of distance 382X, distance 754, and angle 752 may be determined according to properties of imaging lens 710 such that all light reaching pixel array 214 via imaging lens 710 also propagates through thin film 240. For example, a ray 760 propagates from an edge 709E of exit pupil 709 to the edge of pixel array 214 at angle 762 with respect to direction 298Z. Angle 752, and hence distances 382X and 754, maybe configured such that angle 752 exceeds and 762. Ray 760 is a marginal ray, for example.

Figure 8:
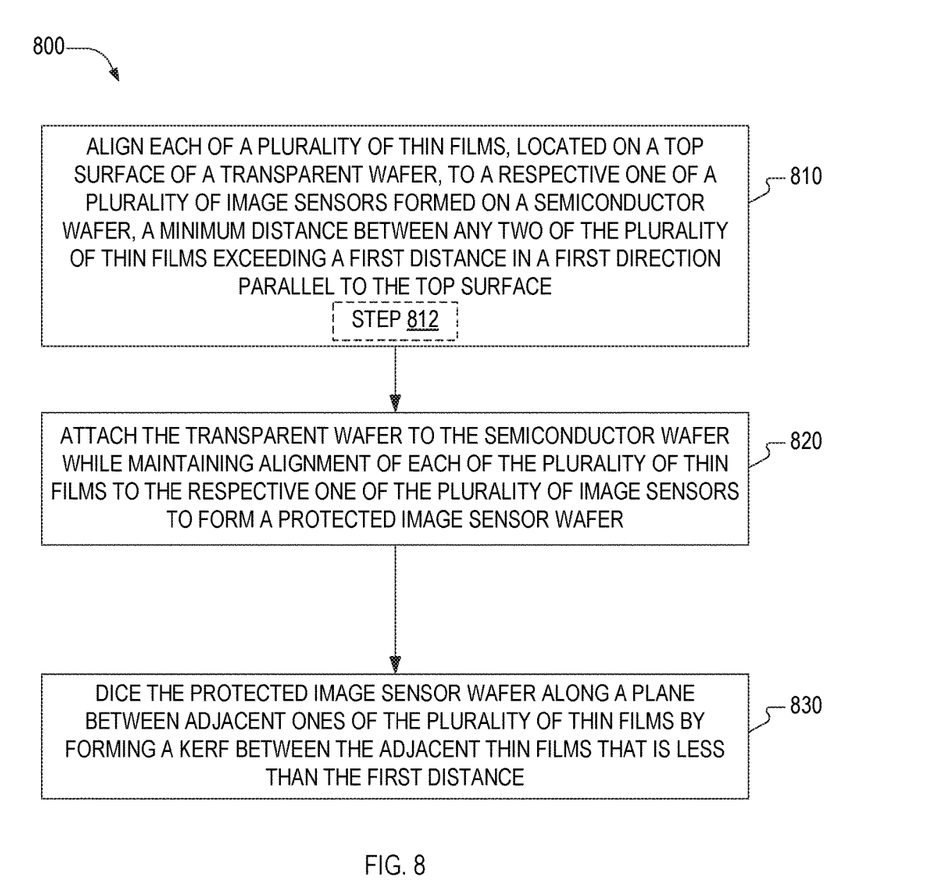
FIG. 8 is a flowchart illustrating a method for forming a chip-scale image sensor package, in an embodiment.

FIG. 8 is a flowchart illustrating a method 800 for forming a chip-scale image sensor package. In step 810, method 800 aligns each of a plurality of thin films, located on a top surface of a transparent wafer, to a respective one of a plurality of image sensors formed on a device wafer. A minimum distance between any two of the plurality of optical filters exceeds a first distance. In an example of step 810, each thin film 240 on transparent wafer 230 is aligned to a respective image sensor die 212 of device wafer 210. Inter-film distances 393X,Y between any two of the plurality of thin films 240 may exceed kerf 392W, which is an example of the first distance of step 810. In step 810, transparent wafer 230 may be aligned to device wafer 210 such that the each thin film 240 is simultaneously aligned to a respective image sensor die 212. Aligning one thin film 240 to one image sensor die 212 may correspond to aligning the thin film 240 to the pixel array 214 of the image sensor die 212.

Step 810 may include step 812, in which each one of the plurality of image sensors has a respective conductive-pad array adjacent to a pixel array thereof. In step 812, the transparent wafer is aligned to the device wafer such that each of the plurality conductive-pad arrays is directly beneath a respective inter-film region between two adjacent ones of the plurality of thin films. In an example of step 812, transparent wafer 230 is aligned to device wafer 210 such that conductive-pad arrays 505A and 505B are directly beneath a respective inter-film region between two adjacent ones of the plurality of thin films 240.

In step 820, method 800 attaches the transparent wafer to the device wafer while maintaining alignment of each of the plurality of thin films to the respective one of the plurality of image sensors to form a protected image sensor wafer. In a first example of step 820, transparent wafer 230 is attached to device wafer 210, while maintaining alignment of each thin film 240 to a respective image sensor die 212, to form encapsulated image-sensor wafer 200. In a second example of step 820, encapsulated image-sensor wafer 200 includes spacer 220, which may be a spacer wafer, as illustrated in FIG. 2. In this second example, encapsulated image-sensor wafer 200 is formed by attaching transparent wafer 230 to top surface 220T of spacer 220 and attaching device wafer 210 to bottom surface 220B of spacer 220 while maintaining alignment of each thin film 240 to a respective aperture 222 and image sensor die 212.

In step 830, method 800 dices the protected image sensor wafer along a plane between adjacent ones of the plurality of thin films by forming a kerf between the adjacent thin films that is less than the first distance. In an example of step 830, encapsulated image-sensor wafer 200 diced along planes 392 by forming kerf 392W between adjacent thin films 240, such as thin films 240(1) and 240(2).

In embodiments of method 800 in which step 830 includes laser grooving the protected image sensor, step 830 may resemble the device wafer processing method of U.S. patent application Ser. No. 11/036,334. In a different example of step 830, the protected image sensor may be singulated by means other than blade-dicing, such as laser-dicing and stealth dicing.

Combinations of Features

Features described above as well as those claimed below may be combined in various ways without departing from the scope hereof. The following examples illustrate some possible, non-limiting combinations:

(A1) A chip-scale image sensor package includes a semiconductor substrate, a transparent substrate, a thin film, and a plurality of conductive pads. The semiconductor substrate has (i) a pixel array, and (ii) a peripheral region surrounding the pixel array. The transparent substrate covers the pixel array, has a bottom substrate surface proximate the pixel array, and a top substrate surface opposite the bottom substrate surface. The thin film is on a region of the top substrate surface directly above both (i) the entire pixel array and (ii) a portion of the peripheral region adjacent to the pixel array. Each of the plurality of conductive pads is located within the peripheral region and is electrically connected to the pixel array. A portion of each of the plurality of conductive pads is not directly beneath the thin film.

(A2) In the chip-scale image sensor package denoted by (A1), in a first cross-section perpendicular to the top substrate surface, the transparent substrate may be wider than the thin film in a first direction parallel to the top substrate surface.

(A3) In the chip-scale image sensor package denoted by (A2), the transparent substrate may be wider, in the first direction, than the thin film by at least a maximum width of the plurality of conductive pads.

(A4) In a chip-scale image sensor package denoted by one of (A2) and (A3), in a second cross-section perpendicular to both the top substrate surface and the first cross-section, the transparent substrate may be wider than the thin film in a second direction parallel to the top substrate surface.

(A5) In a chip-scale image sensor package denoted by one of (A4), the transparent substrate may be wider, in the second direction, than the thin film by at least a maximum width of the plurality of conductive pads.

(A6) In any chip-scale image sensor package denoted by one of (A1) through (A5), the thin film may be a multilayer film having pass band corresponding to one of visible light and near-infrared light.

(A7) An imaging system includes (i) any chip-scale image sensor package denoted by (A1)-(A6), (ii) an aperture stop and a corresponding exit pupil, and (iii) an imaging lens. The thin film has an edge region directly above the peripheral region. The imaging lens is configured to image light incident thereon on the pixel array such that a ray propagating from an edge of the exit pupil propagates through the edge region of the thin film and is incident on a pixel located at an edge of the pixel array.

(B1) An encapsulated image-sensor wafer includes a device wafer, a transparent wafer, a plurality of thin films, and a plurality of conductive pads. The device wafer has (i) a plurality of pixel arrays on a first surface of the device wafer, and (ii) a peripheral region surrounding the plurality of pixel arrays. The transparent wafer covers each of the plurality of pixel arrays, has a bottom wafer surface proximate each of the plurality of pixel arrays, and has a top wafer surface opposite the bottom substrate surface. Each of the plurality of thin films is on the top wafer surface. Any two adjacent thin films of the plurality of thin films are separated by an inter-film region of the top wafer surface therebetween. Each of the plurality of pixel arrays is entirely beneath a respective one of the plurality of thin films. Each of the plurality of conductive pads is within the peripheral region and is electrically connected to one of the plurality of pixel arrays. A portion of each of the plurality of conductive pads is directly beneath an inter-film region.

(B2) In the encapsulated image-sensor wafer denoted by (B1), the entirety of each of the plurality of conductive pads may be directly beneath an inter-film region.

(B3) In any encapsulated image-sensor wafer denoted by (B1) and (B2), the thin film may be a multilayer film having pass band corresponding to one of visible light and near-infrared light.

(C1) A method for forming a chip-scale image sensor package includes steps of aligning, attaching, and dicing. In the step of aligning, each of a plurality of thin films, located on a top surface of a transparent wafer, is aligned to a respective one of a plurality of image sensors formed on a device wafer. A minimum distance between any two of the plurality of thin films exceeds a first distance in a first direction parallel to the top surface. In the step of attaching, the transparent wafer is attached to the device wafer while maintaining alignment of each of the plurality of thin films to the respective one of the plurality of image sensors to form a protected image sensor wafer. In the step of dicing, the protected image sensor wafer is diced along a plane between adjacent ones of the plurality of thin films by forming a kerf between the adjacent thin films that is less than the first distance.

(C2) In the method denoted by (C1), each one of the plurality of image sensors may have a respective conductive-pad array adjacent to a pixel array thereof. The step of aligning may include: aligning the transparent wafer to the device wafer such that each of the plurality conductive-pad arrays is directly beneath a respective inter-film region between two adjacent ones of the plurality of thin films.

Changes may be made in the above methods and systems without departing from the scope hereof. It should thus be noted that the matter contained in the above description or shown in the accompanying drawings should be interpreted as illustrative and not in a limiting sense. Herein, and unless otherwise indicated, the adjective "exemplary" means serving as an example, instance, or illustration. The following claims are intended to cover all generic and specific features described herein, as well as all statements of the scope of the present method and system, which, as a matter of language, might be said to fall therebetween.

What is claimed is:

1. A chip-scale image sensor package comprising:
   a semiconductor substrate having (i) a pixel array, and (ii) a peripheral region surrounding the pixel array;
   a transparent substrate, covering the pixel array, having a bottom substrate surface proximate the pixel array, and a top substrate surface opposite the bottom substrate surface;
   a thin film on a region of the top substrate surface directly above both (i) the entire pixel array and (ii) a portion of the peripheral region adjacent to the pixel array, in a first cross-section perpendicular to the top substrate surface, the transparent substrate being wider than the thin film in a first direction parallel to the top substrate surface; and
   a plurality of conductive pads within the peripheral region and electrically connected to the pixel array, a portion of each of the plurality of conductive pads not being directly beneath the thin film.

2. The chip-scale image sensor package of claim 1, the transparent substrate being wider, in the first direction, than the thin film by at least a maximum width of the plurality of conductive pads.

3. The chip-scale image sensor package of claim 1, in a second cross-section perpendicular to both the top substrate surface and the first cross-section, the transparent substrate being wider than the thin film in a second direction parallel to the top substrate surface.

4. The chip-scale image sensor package of claim 3, the transparent substrate being wider, in the second direction, than the thin film by at least a maximum width of the plurality of conductive pads.

5. The chip-scale image sensor package of claim 1, the thin film being a multilayer film having pass band corresponding to one of visible light and near-infrared light.

6. An encapsulated image-sensor wafer comprising:
   a device wafer having (i) a plurality of pixel arrays on a first surface of the device wafer, and (ii) a peripheral region surrounding the plurality of pixel arrays;

a transparent wafer covering each of the plurality of pixel arrays, having a bottom wafer surface proximate each of the plurality of pixel arrays, and a top wafer surface opposite the bottom substrate surface;

a plurality of thin films on the top wafer surface, any two adjacent thin films of the plurality of thin films being separated by an inter-film region of the top wafer surface therebetween, each of the plurality of pixel arrays being entirely beneath a respective one of the plurality of thin films; and a plurality of conductive pads within the peripheral region, each electrically connected to one of the plurality of pixel arrays, a portion of each of the plurality of conductive pads being directly beneath an inter-film region.

7. The encapsulated image-sensor wafer of claim 6, the entirety of each of the plurality of conductive pads being directly beneath an inter-film region.

8. The encapsulated image-sensor wafer of claim 6, the thin film being a multilayer film having pass band corresponding to one of visible light and near-infrared light.

9. A method for forming a chip-scale image sensor package, comprising:

aligning each of a plurality of thin films, located on a top surface of a transparent wafer, to a respective one of a plurality of image sensors formed on a device wafer, a minimum distance between any two of the plurality of thin films exceeding a first distance in a first direction parallel to the top surface;

attaching the transparent wafer to the device wafer while maintaining alignment of each of the plurality of thin films to the respective one of the plurality of image sensors to form a protected image sensor wafer; and dicing the protected image sensor wafer along a plane between adjacent ones of the plurality of thin films by forming a kerf between the adjacent thin films that is less than the first distance.

10. The method claim 9, each one of the plurality of image sensors having a respective conductive-pad array adjacent to a pixel array thereof, and, in the step of aligning, aligning the transparent wafer to the device wafer such that each of the plurality conductive-pad arrays is directly beneath a respective inter-film region between two adjacent ones of the plurality of thin films.

* * * * *